United States Patent [19]

Bai et al.

[11] Patent Number: 5,714,418
[45] Date of Patent: Feb. 3, 1998

[54] DIFFUSION BARRIER FOR ELECTRICAL INTERCONNECTS IN AN INTEGRATED CIRCUIT

[75] Inventors: Gang Bai, San Jose; David B. Fraser, Danville, both of Calif.

[73] Assignee: Intel Corporation, Santa Clara, Calif.

[21] Appl. No.: 555,491

[22] Filed: Nov. 8, 1995

[51] Int. Cl.⁶ .................................................. H01L 21/441
[52] U.S. Cl. ......................... 438/627; 438/628; 438/629; 438/687; 438/688
[58] Field of Search .................................. 437/192, 190, 437/198, 203, 245; 438/627, 628, 629, 643, 653, 687, 688

[56] References Cited

U.S. PATENT DOCUMENTS

| | | | |
|---|---|---|---|
| 5,312,774 | 5/1994 | Nakamura et al. | 437/192 |
| 5,354,712 | 10/1994 | Ho et al. | 437/195 |
| 5,380,678 | 1/1995 | Yu et al. | 437/190 |
| 5,391,517 | 2/1995 | Gelatos et al. | 437/190 |
| 5,527,739 | 6/1996 | Parillo et al. | 438/627 |

Primary Examiner—John Niebling
Assistant Examiner—C. Everhart
Attorney, Agent, or Firm—Blakely, Sokoloff, Taylor & Zafman

[57] ABSTRACT

An electrical interconnect structure comprising a diffusion barrier and a method of forming the structure over a semiconductor substrate. A bi-layer diffusion barrier is formed over the substrate. The barrier comprises a capturing layer beneath a blocking layer. The blocking layer is both thicker than the capturing layer and is unreactive with the capturing layer. A conductive layer, thicker than the blocking layer, is then formed over the barrier. While the conductive layer is unreactive with the blocking layer of the barrier, the conductive layer is reactive with the capturing layer of the barrier.

20 Claims, 3 Drawing Sheets

5,714,418

DIFFUSION BARRIER FOR ELECTRICAL INTERCONNECTS IN AN INTEGRATED CIRCUIT

FIELD OF THE INVENTION

The present invention relates to semiconductor processing and more particularly to a bi-layer diffusion barrier for electrical interconnects.

BACKGROUND OF THE INVENTION

As the demand increases for cheaper, faster, lower power consuming integrated circuits, such as microprocessors, the transistor packing density of the integrated circuit must be similarly increased. To do so, the device dimensions of the integrated circuit are continually shrunk. Very large scale integration (VLSI) techniques have continually evolved to meet the increasing demand. All aspects of the integrated circuit must be scaled down to fully minimize the device dimensions. In addition to minimizing transistor dimensions, one must minimize the dimensions of the electrical interconnections which connect the transistors together on a microchip to form a complete circuit.

Currently, aluminum alloys are the most commonly used conductive materials for electrical interconnections in a VLSI integrated circuit. Aluminum and its alloys have been fully characterized for use as electrical interconnections, and much technology has been developed to aid in the formation of aluminum interconnections. Aluminum has very attractive features for use as an electrical interconnection, such as low electrical resistivity and strong adhesion to silicon dioxide. However, as VLSI dimensions reach into the deep-sub micron Ultra Large Scale Integration (ULSI) regime, the deficiencies of aluminum and its alloys become limiting factors in achieving superior performance. For example, as the width of electrical interconnections becomes narrower, even the low resistance of aluminum becomes non-negligible and begins to slow down the circuit. Additionally, with decreasing dimensions, design rules become increasingly restricted by aluminum interconnection reliability concerns such as electromigration, stress-induced void formation, hillock suppression, and current density limitations.

For these reasons, the microelectronics industry has recently migrated towards the investigation of more robust, more conductive metals for use in interconnection technology such as Copper (Cu). Cu is approximately 40% lower in resistivity than Al and is much more resistant to reliability problems such as electromigration. Unfortunately, Cu has been known to cause other reliability problems associated with the high rate of Cu diffusion through silicon substrates and dielectric films. One such problem is electrical shorting, wherein the Cu from one Cu interconnect line diffuses into an adjacent dielectric region, forming a conductive path to another Cu interconnect line. Another problem is transistor poisoning, wherein Cu diffuses into the underlying silicon substrate and causes junction leakage along with reduced channel mobility in the transistor, thereby destroying the device. Therefore, to implement Cu as an interconnect material it has become necessary to develop methods for preventing Cu from diffusing through a semiconductor device.

One method for preventing copper diffusion through a semiconductor device is to employ a barrier between the copper interconnect and adjacent materials of the semiconductor device. FIG. 1 shows a cross section of a substrate 10 upon which a barrier 11 and a copper layer 12 are formed. Barrier 11 comprises a material which impedes the diffusion of copper from copper layer 12 into the underlying substrate 10. As shown, barrier 11 is not perfect. Barrier 11 comprises micro-defects 13 such as pinholes or voids in the film, and the barrier further comprises a number of grain boundaries, two of which ,14 and 15, are illustrated in FIG. 1. Micro-defect 13, along with grain boundaries 14 and 15, act as weak spots in the barrier, permitting copper from copper layer 12 to diffuse through to the underlying substrate 10. As shown, within micro-defect region 13 the copper of copper layer 12 comes into direct contact with substrate 10. Substrate 10 comprises silicon and silicon dioxide, through which copper will rapidly diffuse from the micro-defect in the barrier, particularly at elevated temperatures. Similarly, copper rapidly diffuses along grain boundaries of the barrier when subjected to elevated temperatures.

To better isolate copper layer 12 from the underlying substrate 10, the thickness of barrier 11 is simply increased. However, increasing the thickness of the barrier also increases the resistance of the resulting copper interconnect as illustrated in FIG. 2. FIG. 2 shows a cross section of a substrate 20 upon which an electrical interconnect comprising copper layer 23 and barrier 22 has been formed adjacent to dielectric material 21. As shown, the thickness of barrier layer 22 is large in comparison to the thickness of copper layer 23. It is necessary for barrier 22 to be thick enough to adequately prevent the diffusion of copper from copper layer 23 into either dielectric material 21 or substrate 20. Forming a thicker barrier reduces copper diffusion through micro-defects because the defects are more likely to be incorporated into the bulk of the barrier, thereby reducing diffusion paths through the defect. In addition, while a thicker barrier may still comprise grain boundaries leading from the upper to lower surface of the barrier, these boundaries are necessarily longer, thereby slowing copper diffusion and increasing the likelihood that a copper atom is blocked by, for example, a precipitate along the boundary. Because the grain boundaries are long, it would take a longer time for copper to diffuse through the length of these longer grain boundaries. While some copper atoms may successfully diffuse through these grain boundaries, it is expected that other reliability limitations of the integrated circuit will cause the device to fail by an alternate failure mechanism.

Note that as the thickness of barrier 22 increases, the volume which the highly conductive copper layer 23 occupies of the overall electrical interconnect decreases. Unfortunately, barrier 22 comprises materials which are at least 10 times more electrically resistive than copper, such as, for example, a dielectric such as silicon nitride. Therefore, increasing the barrier thickness while maintaining the overall width of the interconnect increases the total resistance of the electrical interconnect due to the reduction in volume that the low resistance copper material can occupy. The total width of the interconnect could be increased to counteract the increased resistance, but doing so would reduce the density of the integrated circuit.

Increasing the resistance of the electrical interconnect by increasing the thickness of barrier 22 defeats the advantages of employing copper as an interconnect material in the first place. As a result, the speed at which the integrated circuit operates is reduced. Thus, what is desired is a thin diffusion barrier which permits the low resistivity of copper or other interconnect material to be exploited in an electrical interconnect.

SUMMARY OF THE INVENTION

An electrical interconnect structure comprising a diffusion barrier is described, along with a method of forming the structure over a semiconductor substrate. A bi-layer diffusion barrier is formed over the substrate. The barrier comprises a capturing layer beneath a blocking layer. The blocking layer is both thicker than the capturing layer and is unreactive with the capturing layer. A conductive layer, thicker than the blocking layer, is then formed over the barrier. While the conductive layer is unreactive with the blocking layer of the barrier, the conductive layer is reactive with the capturing layer of the barrier.

Other features and advantages of the present invention will be apparent from the accompanying drawings and the detailed description that follows.

BRIEF DESCRIPTION OF THE DRAWINGS

The present invention is illustrated by way of example and not limitation in the figures of the accompanying drawings in which like references indicate similar elements and in which.

DETAILED DESCRIPTION

A method of forming a diffusion barrier for electrical interconnects in an integrated circuit which overcomes the deficiencies of the prior art is described. In the following description, numerous specific details such as layer thicknesses, process sequences, times, temperatures, etc. are set forth in order to provide a more thorough understanding of the present invention. It will be apparent, however, to one skilled in the art, that the present invention may be practiced without employing these specific details. In other instances, well-known processes and processing techniques have not been described in detail in order to avoid unnecessarily obscuring the present invention.

In general, in accordance with an embodiment of the present invention a bi-layer barrier is employed comprising a blocking layer and a capturing layer. The blocking layer serves as the primary barrier to prevent copper diffusion. It comprises materials that do not react with copper at processing temperatures and are mutually immiscible with copper. The blocking layer is relatively thick in comparison to the underlying capturing layer of the barrier. The capturing layer serves as a secondary barrier to prevent further diffusion of copper atoms which make their way through the blocking layer. The capturing layer comprises materials that react easily with copper, but do not react with the blocking layer. Copper atoms which leak through the blocking layer are captured in the capturing layer by chemically bonding with materials in the capturing layer.

The structure of a diffusion barrier for the electrical interconnects of an integrated circuit is described in more detail below, along with its particular application in a damascene process.

Figure 3:
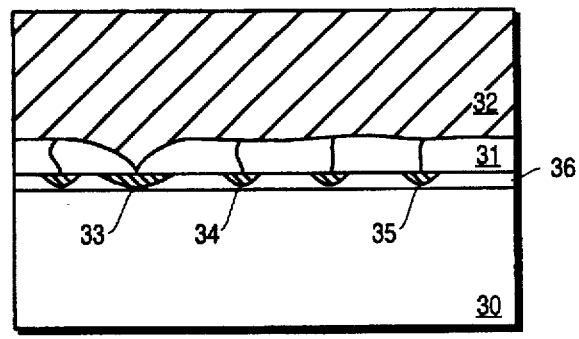
FIG. 3 is an illustration of a cross-sectional view of a substrate upon which a copper layer and a barrier have been formed in accordance with an embodiment of the present invention.

FIG. 3 shows a cross-section of a substrate 30 upon which a highly conductive layer 32 and a barrier, comprising a blocking layer 31 and a capturing layer 36, have been formed in an accordance with an embodiment of the present invention. Blocking layer 31 is the primary barrier preventing diffusion of material from highly conductive layer 32 into the underlying substrate 30. However, because blocking layer 31 is relatively thin, it cannot entirely block the diffusion of material from the highly conductive layer. Some amount of the material will leak through blocking layer 31, particularly at weak spots in the film.

As discussed above, in conjunction with prior art barriers, these weak spots include micro-defects, such as, for example, voids or pinholes, and may also include grain boundaries which extend from the upper to lower surfaces of the blocking layer. The occurrence of micro-defects may be reduced by subjecting blocking layer 31 to an anneal processing step, as discussed below. The grain boundaries of blocking layer 31, through which material can more readily diffuse, result from the columnar grain structure of blocking layer 31. For one embodiment of the present invention, the blocking layer is formed having smaller, random grain structures, resulting in effectively longer, slower, diffusion paths, rather than short, fast ones. For another embodiment of the present invention, the blocking layer is formed from an amorphous material, thereby eliminating grain boundary diffusion by eliminating grain boundaries altogether.

In accordance with an embodiment of the present invention, blocking layer 31 is substantially unreactive with both the overlying highly conductive layer 32 and underlying capturing layer 36. In addition, blocking layer 31 is mutually immiscible with layer 32, meaning that material of highly conductive layer 32 will not dissolve in blocking layer 31, nor will the material of blocking layer 31 dissolve into layer 32. The meaning of "substantially unreactive" is that for the temperatures to which blocking layer 31, capturing layer 36, and highly conductive layer 32 are subjected during manufacturing and use of the integrated circuit, chemical reactions will not take place at the interfaces of these layers to such an extent that the one layer is reactively consumed by another.

For example, for a preferred embodiment of the present invention, the material selected for blocking layer 31 remains substantially unreactive with both capturing layer 36 and highly conductive layer 32 up to a temperature of approximately 500° C., the temperature at which interlayer dielectrics are likely to be deposited during the manufacturing process. However, the layers may become reactive at higher temperatures. For another embodiment, the material selected for blocking layer 31 remains substantially unreactive with both capturing layer 36 and highly conductive layer 32 up to a temperature of approximately 200° C., the temperature at which the integrated circuit is likely to be operated. However, the layers may become reactive at higher temperatures. For another embodiment of the present invention, blocking layer 31 remains substantially unreactive with capturing layer 36 and highly conductive layer 32 at approximately room temperature. However, the layers may become reactive at higher temperatures.

The thickness of blocking layer 31 is selected to provide the proper balance between adequate blocking or retarding of diffusion from material in highly conductive layer 32 through layer 31 while accommodating maximum conductivity of the electrical interconnect formed in accordance with the present invention. Increasing the thickness of blocking layer 31 generally reduces the amount of material which leaks through the blocking layer, however, increasing the thickness of this layer also increases the resistance of the electrical interconnect, thereby degrading the performance of the overall integrated circuit. This is because, as previously discussed, the volume occupied by blocking layer 31 displaces the volume available for the highly conductive material in layer 32. Because highly conductive layer 32 has a significantly lower resistance than blocking layer 31, displacing the volume of the lower resistance material with a higher resistance blocking layer has the effect of increasing the overall resistance of the interconnect. For one embodiment of the present invention, the blocking layer is in the range of approximately 100 Å, to 300 Å, a range which may be found useful for minimum dimension interconnect lines in advanced ULSI processes. For another embodiment, the blocking layer is in the range of approximately 50 Å, to 500 Å. For other embodiments, the thickness of the blocking layer of a diffusion barrier is in the range of approximately 10 Å, to 1000 Å. Thinner blocking layers are generally applicable to processes employing more narrow interconnect lines, while thicker layers may be found sufficient for wider interconnect lines.

For one embodiment of the present invention, the blocking layer comprises an electrically conductive material such as, for example, tantalum (Ta), tantalum nitride (TAN), titanium nitride (TIN), hafnium nitride (HfN), vanadium (V), niobium (Nb), chromium (Cr), tungsten (W), molybdenum (Mo), or some combination of these materials. Because the blocking layer comprises a conductive material, the blocking layer is able to contribute to the electrical conduction of the interconnect. This embodiment is useful for applications in which an interconnect formed in accordance with the present invention is used as a low resistance, electrical contact with an underlying conductive region.

For another embodiment of the present invention, the blocking layer comprises non-conductive materials which provide a suitable primary barrier to diffusion, such as, for example, silicon nitride (nitride). In this embodiment, the blocking layer is removed from the area beneath the highly conductive layer which overlies a conductive region, allowing electrical contact to be made to the underlying conductive region.

For one embodiment of the present invention, the blocking layer is deposited by sputtering onto the surface of the underlying substrate, and is subsequently annealed to aid in the elimination of micro-defects in the blocking layer, thereby providing a more robust barrier. For another embodiment, the blocking layer is deposited by chemical vapor deposition.

Capturing layer 36 serves as a secondary, or "backup" barrier which traps any atoms that leak through blocking layer 31 from highly conductive layer 32. Capturing layer 36 is able to capture atoms which leak through barrier 31 by chemically bonding these atoms into a compound which is less likely to diffuse beyond the capturing layer. Therefore, regions of capturing layer 36, which primarily reside directly adjacent to weak spots of overlying blocking layer 31 will be transformed into reacted compounds by reacting with material leaking through the weak spots of the blocking layer.

Reacted compound regions of capturing layer 36 are shown in FIG. 3 as regions 33, 34 and 35. Region 33 resides directly below a micro-defect in blocking layer 31, and material leaking through this micro-defect from the highly conductive layer 32 is captured in this region. Regions 34 and 35 reside directly below vertical grain boundaries of blocking layer 31. Material which diffuses along these grain boundaries from highly conductive layer 32 will be captured in regions 34 and 35 upon reacting with the material of capturing layer 36. Note that while capturing layer 36 may also contain grain boundaries, diffusion of atoms from the highly conductive layer is unlikely to occur along these grain boundaries to underlying substrate 30 before being captured into the layer by chemical reaction. In addition, many grain boundaries within layer 36 are not aligned to the grain boundaries and defects in layer 31, thereby reducing the chances that a direct diffusion path will be formed between highly conductive layer 32 and substrate 30.

Because blocking layer 31 provides the primary barrier to diffusion of material from highly conductive layer 32, for one embodiment, capturing layer 36 is chosen to be thick enough to capture as much material as would be expected to leak through blocking layer 31 over the lifetime of the integrated circuit. In accordance with another embodiment of the present invention, because the capturing layer is more resistive than the highly conductive layer, determining the thickness of capturing layer 36 involves the same considerations described above for determining the thickness of blocking layer 31. For example, while increasing the thickness of capturing layer 36 provides for more complete capturing of leaked material, the increased displacement of the highly conductive layer 32 results in higher resistivity and, consequently, poorer speed performance of the integrated circuit. Conversely, reducing the thickness of capturing layer 36 increases the speed of the integrated circuit. However, if too thin, the amount of material in the capturing layer available for chemically bonding with material leaking through the blocking layer may be inadequate to completely capture all the leaked material.

In addition to balancing the interconnect resistivity verses sufficiency of the diffusion barrier, determining the relative thickness between the blocking and capturing layers involves the balancing of other considerations. For example, as the ability of blocking layer 31 to prevent or retard the leakage of highly conductive material through the layer is improved, by, for example, improving the quality or increasing the thickness of the layer, the amount of leaked material which ultimately reaches capturing layer 36 is reduced. Therefore, for this embodiment, the thickness of capturing layer 36 is reduced with respect to the thickness of blocking layer 31. Conversely, as blocking layer 31 is made more leaky, a thicker capturing layer is required. For one embodiment of the present invention, the capturing layer is in the range of approximately 10 Å to 50 Å. For another embodiment, the capturing layer is in the range of approximately 5 Å to 100 Å. For yet another embodiment of the present invention, the capturing layer may be up to 300 Å thick. However, as discussed above, as the barrier thickness is increased, the resistivity of the resulting electrical interconnect is similarly increased, resulting in a slower integrated circuit.

In accordance with an embodiment of the present invention, capturing layer 36 comprises a material which is substantially reactive with the material from highly conductive layer 32. The meaning of "substantially reactive" is that material within the capturing layer forms a chemical compound with material from the conductive layer at the temperatures at which material from the conductive layer is likely to leak through the blocking layer. For example, for one embodiment, capturing layer 36 reacts with material from the highly conductive layer at a temperature of approximately 500° C., the temperature at which the integrated circuit is likely to be exposed during the manufacturing process. For another embodiment, the capturing layer is substantially reactive with leaked material at a temperature of approximately 200° C., the temperature at which the integrated circuit may be operated. For yet another embodiment of the present invention, materials within the capturing layer are substantially reactive with leaked material from the highly conductive layer at temperatures as low as approximately room temperature.

In accordance with an embodiment of the present invention, capturing layer 36 is electrically conductive and provides good adhesion to the underlying substrate 30. For example, materials such as titanium (Ti), aluminum (Al), zirconium (Zr), hafnium (Hf), scandium (Sc), or some combination of these materials may be employed as a capturing layer. By using a conductive capturing layer, the capturing layer takes part in the conduction of electricity through the resulting electrical interconnect. This embodiment of the present invention is useful for applications which the electrical interconnect is formed over another conductive material for making a good, low resistance, electrical contact thereto. For one embodiment of the present invention, the capturing layer is deposited by sputtering onto the surface of the underlying substrate, and is subsequently annealed to aid in the elimination of micro-defects in the capturing layer, thereby providing a more robust barrier. For another embodiment of the present invention, the capturing layer is non-conductive.

In accordance with one embodiment of the present invention, highly conductive layer 32 primarily comprises copper, such as pure copper or an alloy thereof. While pure copper generally provides the best electrical conduction of the resulting interconnect, small amounts of other materials may be added to the copper to form copper alloys having, for example, improved resistance to corrosion. For another embodiment of the present invention, materials other than or in addition to copper are formed over the barrier to create electrical interconnects having similarly reduced resistances. Other materials which may be employed in accordance with alternate embodiments of the present invention include, for example, Gold (Au), Silver (Ag), or aluminum with a high copper percentage (in excess of, for example, 30%).

An electrical interconnect formed in accordance with the present invention may be used in conjunction with any of a multitude of applications requiring electrical coupling between one region of an integrated circuit and another region of the circuit. For one embodiment of the present invention, the electrical interconnect is employed as a gate electrode for a transistor. For another embodiment, the electrical interconnect is used as a contact or contact plug to electrically couple an overlying metalization layer to an underlying silicon or polysilicon region. For another embodiment, the electrical interconnect is used in a metalization layer to electrically couple various components of the integrated circuit together. For another embodiment of the present invention, the electrical interconnect is a via, coupling one metalization layer to another. For these and other embodiments of the present invention, the substrate upon which the barrier is formed comprises either dielectric or conductive materials.

A manufacturing process in accordance with an embodiment of the present invention is described below in conjunction with FIGS. 4A to 4D. FIGS. 4A through 4D, along with the accompanying description, demonstrate an application in which an electrical interconnect comprising copper as the highly conductive material is implemented in a damascene process for creating a metalization layer of an integrated circuit.

Figure 4A:
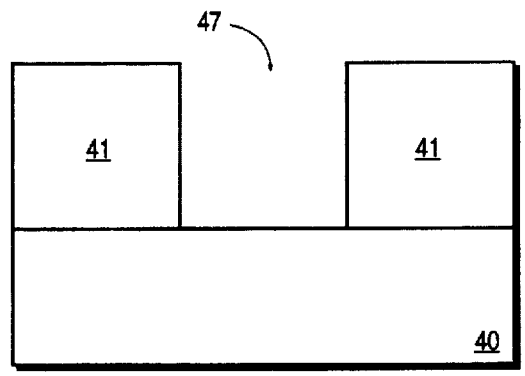
FIG. 4A is an illustration of a cross-sectional view of a substrate upon which a dielectric layer has been formed and subsequently etched to create a trench.

FIG. 4A shows a cross-section of substrate 40, upon which a dielectric layer 41 has been formed and subsequently etched to create a trench 47. Substrate 40 is a semiconductor substrate which contains active devices upon which dielectric and conductive layers have been formed. These active devices are integrated by the electrical interconnect formed in accordance with an embodiment of the present invention. Layer 41 of FIG. 4A is a dielectric layer used to physically and electrically isolate the subsequently formed electrical interconnect from the rest of the integrated circuit. Dielectric layer 41 comprises silicon dioxide (oxide). Other dielectric layers which may be implemented in accordance with alternate embodiments of the present invention include silicon nitride (nitride), silicon oxynitride, a doped oxide, or any other dielectric material which is compatible with an integrated circuit manufacturing technology.

Trench region 47 is a cross-section of a long groove (running substantially perpendicular to the page) which is to be filled with conductive material to become an electrical interconnection of the integrated circuit. The width of trench 47 is approximately 0.4 microns and is formed by an anisotropic plasma etch using photolithographic techniques. For an alternate embodiment, a trench is formed by any one of a number of other etch techniques which provide the substantially anisotropic profile shown. For another embodiment, the width of the trench is in the range of approximately one micron to well within the deep submicron regime of 0.2 microns and below.

Figure 4B:
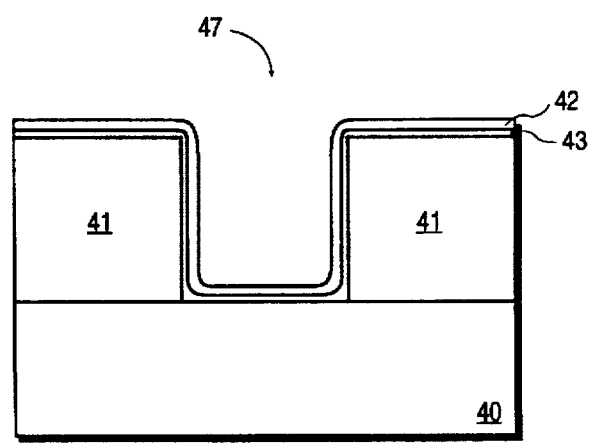
FIG. 4B is an illustration of the cross-sectional view of FIG. 4A after a barrier has been formed in accordance with an embodiment of the present invention.

FIG. 4B shows the cross-section of FIG. 4A after a barrier comprising a capturing layer 43 and a blocking layer 42 has been formed in accordance with an embodiment of the present invention. For one embodiment, capturing layer 43 and blocking layer 42 are titanium and tantalum, respectively, and are deposited by sputtering onto the surface of the underlying substrate. For another embodiment of the present invention, capturing and blocking layers are deposited by a chemical vapor deposition (CVD) process. Note that the titanium in the capturing layer reacts with copper to form, for example, $Ti_2Cu$, thereby capturing any copper leaked into the layer.

An important aspect of the deposition of capturing layer 43 and blocking layer 42 is that the bottom and sides of trench 47 are sufficiently coated with both the capturing and blocking layer materials to provide an adequate barrier to the subsequently deposited copper layer. The capturing layer is approximately 50 Å thick while the blocking layer is approximately 300 Å thick. For alternate embodiments, the thicknesses of capturing layer 43 and blocking layer 42 are selected in accordance with the considerations described above in conjunction with FIG. 3.

For one embodiment of the present invention, after capturing layer 43 and blocking layer 42 are formed over the substrate, the capturing and blocking layers are subjected to a high temperature process step to anneal the barrier. By annealing the barrier, micro-defects which may exist in the capturing or blocking layers are effectively cured thereby increasing the effectiveness of the barrier. For one embodiment, annealing the barrier at 500° C. for one hour provides adequate curing of the capturing and blocking layers. For another embodiment of the present invention, this anneal step is not performed, and, instead, the process flow proceeds directly from formation of the barrier of FIG. 4B to deposition of copper in FIG. 4C.

Figure 4C:
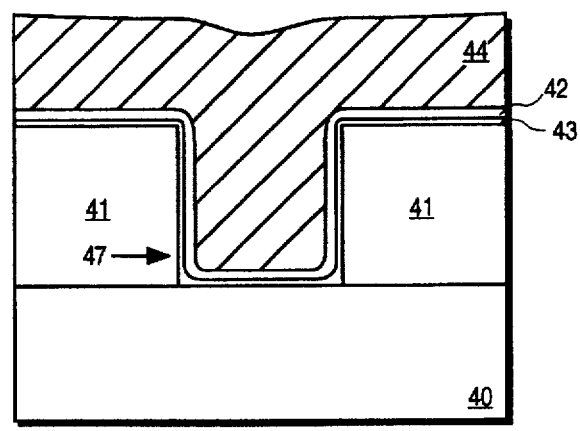
FIG. 4C is an illustration of the cross-sectional view of FIG. 4B after metal has been deposited in the trench.

FIG. 4C shows the cross-section of FIG. 4B after copper layer 44 has been the deposited. Copper layer 44 is deposited onto the barrier, comprising blocking layer 42 and capturing layer 43, by sputter deposition of substantially pure copper. For another embodiment of the present invention, copper layer 44 is formed by a CVD process. The particular method selected for forming copper layer 44 should provide adequate filling of trench 47 without forming voids.

Figure 4D:
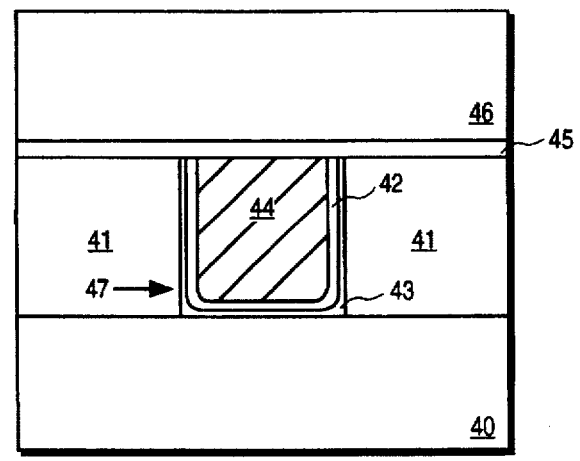
FIG. 4D is an illustration of the cross-sectional view of FIG. 4C after the surface of the substrate has been etched-back and dielectric layers have subsequently been formed.

FIG. 4D shows the cross section of FIG. 4C after the surface of the substrate has been removed and dielectric layers 45 and 46 have subsequently been formed. For one embodiment of the present invention, a chemical mechanical polishing process is used to remove copper layer 44, blocking layer 42, and capturing layer 43, from the upper surfaces of dielectric layer 41. Thus, the portion of copper layer 44 which exists substantially outside trench 47 is removed, thereby isolating copper layer 44 within the trench. Dielectric layer 45 comprises nitride which serves as an upper barrier to copper diffusion from copper layer 44. For one embodiment, dielectric layer 46 comprises an oxide material.

Figure 1:
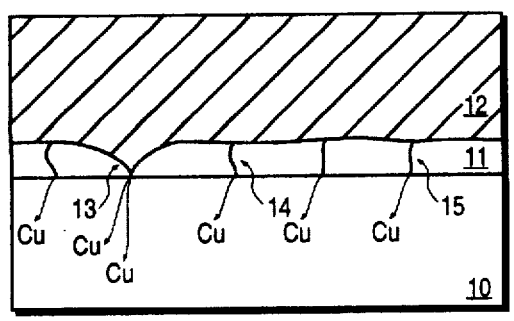
FIG. 1 is an illustration of a cross-sectional view of a substrate having a copper layer and a barrier layer formed thereon.
Figure 2:
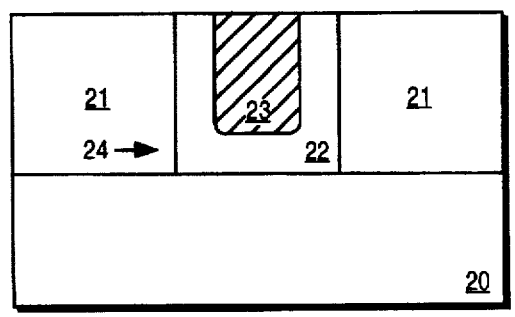
FIG. 2 is an illustration of a cross-sectional view of a substrate having a cooper interconnect and barrier layer formed thereon.

The final electrical interconnect formed in accordance with the embodiment of the present invention shown in FIGS. 4A to 4D comprises copper layer 44 along with the barrier comprising blocking layer 42 and capturing layer 43 within trench 47. Comparing the cross-section of the electrical interconnect of FIG. 4D to the electrical interconnect of FIG. 2, one advantage of the present invention can be seen. Namely, because the proportional volume occupied by the highly conductive copper material in an electrical interconnect formed in accordance with an embodiment of the present invention is much greater, interconnect resistance is reduced, and performance of the resulting integrated circuit is therefore improved. In addition, the reduction in copper diffusion through a barrier formed in accordance with one embodiment of the present invention is improved over a prior art barrier of approximately equal thickness by two orders of magnitude.

In accordance with another embodiment of the present invention, an electrical interconnect is formed by direct patterning of the interconnect material rather than by the damascene process of FIGS. 4A–D. For this embodiment, a first barrier, comprising a blocking and capturing layer, is formed over the surface of a substrate. A highly conductive material, such as copper, is subsequently deposited over the first barrier. The barrier and conductive layer are then patterned and etched using photolithographic and anisotropic etching techniques. Thereafter, a second barrier, comprising a blocking and capturing layer, is conformally deposited over the patterned surface by first depositing the blocking layer, then the capturing layer. This second barrier is then anisotropically etched back to remove the second barrier from the regions on top of and between conductive lines, effectively forming barrier sidewalls on the conductive lines. Next, a dielectric material comprising nitride is deposited over the surface of the substrate to further seal the interconnects. For yet another embodiment, the first barrier layer is not formed, and the conductive material is deposited directly onto an underlying nitride film.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method of forming an electrical interconnect over a semiconductor substrate, the method comprising the steps of:
   a. forming a capturing layer over the substrate, the capturing layer having a thickness in the range of approximately 5 Å to 100 Å;
   b. forming a blocking layer over the capturing layer, the blocking layer being substantially unreactive with the capturing layer at approximately room temperature and having a thickness in the range of approximately 10 Å to 500 Å; and
   c. forming a conductive layer directly on the blocking layer, the conductive layer being both thicker than the blocking layer and substantially unreactive with the blocking layer at approximately room temperature, the conductive layer further being substantially reactive with the capturing layer.

2. The method of claim 1, wherein the conductive layer primarily comprises Cu.

3. The method of claim 2, wherein the capturing layer is electrically conductive and comprises a material selected from the group consisting of Ti, Al, Zr, Hf, Sc, and any combination thereof.

4. The method of claim 2, wherein the blocking layer is electrically conductive and comprises a material selected from the group consisting of Ta, TaN, TiN, HfN, V, Nb, Cr, W, Mo, and any combination thereof.

5. The method of claim 1, wherein the blocking layer is substantially unreactive with both the capturing layer and the conductive layer up to a temperature of approximately 200° C.

6. The method of claim 1, wherein the blocking layer is substantially unreactive with both the capturing layer and the conductive layer up to a temperature of approximately 500° C.

7. The method of claim 1, wherein the conductive layer is substantially reactive with the capturing layer at a temperature of approximately 200° C.

8. The method of claim 1, wherein the conductive layer is substantially reactive with the capturing layer at approximately room temperature.

9. The method of claim 1, wherein the capturing layer has a thickness in the range of approximately 10 Å to 50 Å and the blocking layer has a thickness in the range of approximately 100 Å to 300 Å.

10. A method of forming an electrical interconnect over a semiconductor substrate, the method comprising the steps of:
   a. forming an electrically conductive capturing layer over the substrate, the capturing layer having a thickness in the range of approximately 5 Å to 100 Å;
   b. forming an electrically conductive blocking layer over the capturing layer, the blocking layer being both thicker than the capturing layer and substantially unreactive with the capturing layer up to a temperature of approximately 200° C. and having a thickness in the range of approximately 50 Å to 500 Å; and
   c. forming a copper layer directly on the blocking layer, the copper layer primarily comprising copper, the copper layer being both thicker than the blocking layer and substantially unreactive with the blocking layer up to a temperature of approximately 200° C., the copper layer further being substantially reactive with the capturing layer at a temperature of approximately 200° C.

11. The method of claim 10, further comprising the steps of:

d. etching a trench in a dielectric material formed over the substrate; and e. removing a portion of the copper layer which exists outside the trench to substantially isolate the copper layer within the trench.

12. The method of claim 10, wherein the capturing layer comprises a material selected from the group consisting of Ti, Al, Zr, Hf, Sc, and any combination thereof.

13. The method of claim 12, wherein the blocking layer comprises a material selected from the group consisting of Ta, TaN, TiN, HfN, V, Nb, Cr, W, Mo, and any combination thereof.

14. The method of claim 12, wherein the blocking layer comprises a material selected from the group consisting of Ta, TaN, TiN, HfN, V, Nb, Cr, W, Mo, and any combination thereof.

15. The method of claim 10, wherein the copper layer is substantially reactive with the capturing layer at approximately room temperature.

16. A method of forming an electrical interconnect over a semiconductor substrate, the method comprising the steps of:

a. etching a trench in a dielectric material formed over the substrate;

b. forming an electrically conductive capturing layer over the dielectric material, the capturing layer having a thickness in the range of approximately 5 Å to 100 Å;

c. forming an electrically conductive blocking layer over the capturing layer, the blocking layer having a thickness in the range of approximately 50 Å to 500 Å, and being substantially unreactive with the capturing layer up to a temperature of approximately 500° C.;

d. forming a copper layer directly on the blocking layer, the copper layer primarily comprising copper, the copper layer being both thicker than the blocking layer and substantially unreactive with the blocking layer up to a temperature of approximately 500° C., the copper layer further being substantially reactive with the capturing layer at a temperature of approximately 200° C.; and e. removing a portion of the copper layer which exists outside the trench using a chemical-mechanical polishing process to substantially isolate the copper layer within the trench.

17. The method of claim 16, wherein the capturing layer comprises a material selected from/the group consisting of Ti, Al, Zr, Hf, Sc, and any combination thereof.

18. The method of claim 17, wherein the blocking layer comprises a material selected from the group consisting of Ta, TaN, TiN, HfN, V, Nb, Cr, W, Mo, and any combination thereof.

19. The method of claim 16, wherein the capturing layer has a thickness in the range of approximately 10 Å to 50 Å, and the blocking layer has a thickness in the range of approximately 100 Å to 300 Å.

20. The method of claim 18, wherein the capturing layer has a thickness in the range of approximately 10 Å to 50 Å, and the blocking layer has a thickness in the range of approximately 100 Å to 300 Å.

* * * * *